United States Patent [19]
Mori et al.

[11] Patent Number: 5,331,371
[45] Date of Patent: Jul. 19, 1994

[54] ALIGNMENT AND EXPOSURE METHOD

[75] Inventors: Tetsuya Mori, Yokohama; Akiyoshi Suzuki, Tokyo, both of Japan

[73] Assignee: Canon Kabushiki Kaisha, Tokyo, Japan

[21] Appl. No.: 145,656

[22] Filed: Nov. 4, 1993

Related U.S. Application Data

[63] Continuation of Ser. No. 882,762, May 11, 1992, abandoned, which is a continuation of Ser. No. 764,202, Sep. 23, 1991, abandoned.

[30] Foreign Application Priority Data

Sep. 26, 1990 [JP] Japan .................................. 2-254250

[51] Int. Cl.$^5$ ...................... G03B 27/42; G03B 27/32
[52] U.S. Cl. ........................................ 355/53; 355/74; 355/77
[58] Field of Search .................. 355/53, 74, 54, 71, 355/77

[56] References Cited

U.S. PATENT DOCUMENTS

| | | |
|---|---|---|
| 4,474,463 | 10/1984 | Heimer . |
| 4,702,592 | 10/1987 | Geiger et al. ........................ 355/53 |
| 4,758,863 | 7/1988 | Nikkel ................................. 355/53 |
| 4,780,615 | 10/1988 | Suzuki . |
| 4,798,450 | 1/1989 | Suzuki . |
| 4,811,059 | 3/1989 | Hamasaki et al. . |
| 4,853,745 | 8/1989 | Kamiya et al. . |
| 4,875,076 | 10/1989 | Torigoe et al. . |
| 4,883,359 | 11/1989 | Ina et al. . |
| 4,958,082 | 9/1990 | Makinouchi et al. . |
| 5,003,342 | 1/1991 | Nishi . |

FOREIGN PATENT DOCUMENTS

64-28639 1/1989 Japan .
1286309 11/1989 Japan .

Primary Examiner—Monroe H. Hayes
Attorney, Agent, or Firm—Fitzpatrick, Cella, Harper & Scinto

[57] ABSTRACT

A semiconductor device manufacturing exposure method for exposing different portions of a semiconductor wafer with radiation in a step-and-repeat manner includes the steps of: placing the wafer on a wafer chuck; detecting a first mark of the wafer, whereby a wafer mark signal is produced; controlling a rotational position of the wafer chuck on the basis of the wafer mark signal; printing an image of a second mark of a mask on a portion of a photosensitive material layer provided on a portion of the wafer chuck outside the wafer; photoelectrically detecting the image of the second mark of the mask printed on the photosensitive layer, whereby a mask mark signal is produced; producing data necessary for control of movement of the wafer chuck through a stage, by using the mask mark signal; effecting step-and-repeat exposure of the different portions of the wafer by using a radiation beam while controlling the movement of the wafer chuck through the stage on the basis of the produced data; and blocking a portion of the radiation beam with use of a blocking member disposed between a source of the radiation beam and the wafer to prevent exposure of the photosensitive material layer during the step-and-repeat exposure.

15 Claims, 7 Drawing Sheets

ALIGNMENT AND EXPOSURE METHOD

This application is a continuation of application Ser. No. 07/882,762 filed May 11, 1992, now abandoned, which is a continuation of application Ser. No. 07/764,202 filed Sep. 23, 1991, now abandoned.

FIELD OF THE INVENTION AND RELATED ART

This invention relates generally to an exposure apparatus for use in the manufacture of semiconductor microcircuit devices such as integrated circuits (ICs), large scaled integrated circuits (LSIs) and the like. More particularly, the invention is concerned with a unique process and system in relation to alignment and exposure in an alignment and exposure apparatus called a "mask aligner", specifically to control of an exposure zone.

Resolution and alignment accuracy are basic performances required in a mask aligner. Also, the processing ability (throughput) is another essential performance characteristics to make the mask aligner a productive machine. The trend to further miniaturization and the development of higher capacity semiconductor devices has forced further improvements in resolution and alignment accuracy. Also, it is important to ensure higher throughput.

With the miniaturization of devices, there has occurred a transition in an exposure process adopted in mask aligners, that is, there have been developed these type of process the contact/proximity type, the 1:1 mirror projection type and the lens projection type, in this order. At present, a step-and-repeat type reduction projection exposure apparatus (called a "stepper") using exposure light energy of a wavelength 350–450 nm, has prevailed.

Further, as an aligner for the manufacture of the next generation of devices, such a stepper which uses a light source that can supply light of a shorter wavelength (for example, a stepper using as an exposure beam a light having relatively high intensity and short wavelength of the order of 250 nm, such as a laser beam from an excimer laser, for example), is considered as being effective. In this type of mask aligners, higher precision is required, along with the improvements in resolution, in regard to the pattern overlay or superposition accuracy related to overlaying a circuit pattern of a mask or reticle upon a pattern already formed on a wafer.

Thus, development of a unique alignment system that ensures high-precision pattern overlay has been desired. In an attempt to satisfy this, need an improved alignment system has been proposed in Japanese Laid-Open Patent Application, Laid-Open No. 1-28639, published Nov. 17, 1989. In this proposed alignment system, a wafer chuck to be used for holding a wafer through attraction is used also for alignment purposes, and it constitutes an off-axis type alignment system wherein a photosensitive layer is provided on the wafer chuck. Because of this, it can be applicable to a high precision alignment system for an excimer stepper having a difficulty in using a TTL (through the lens) type alignment system.

SUMMARY OF THE INVENTION

Figure 5A:
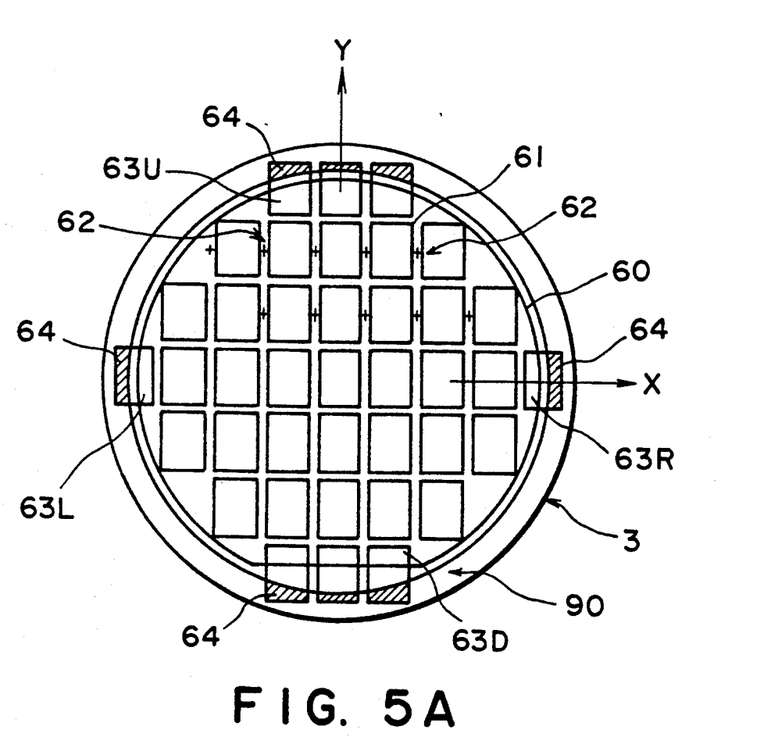
FIGS. 5A and 5B are top plan views, respectively, of a wafer and a wafer chuck of the FIG. 1 apparatus, being processed in accordance with the procedure of FIG. 2.

In a semiconductor device manufacturing process, there are cases wherein as shown in FIG. 5A actual device areas of rectangular patterns extending beyond the outer periphery of a wafer have to be exposed. Frequently, in each case, two or three semiconductor chips are included in one shot to be printed by the stepper, and this exposure is effected to increase the number of chips to be manufactured from a single wafer as much as possible. If, in such case the actual device area is exposed with the same size as the other (regular) shots are exposed, hanging areas 64 are printed on a photosensitive material layer 90 which is provided in a portion of a wafer chuck, around the wafer. This imparts an unnecessary load on the photosensitive material in the areas 64, causing a decrease in the durability limit of the photosensitive recording medium and a decrease in number of repeated uses. Also, the printing of an unnecessary portion leads to degradation of efficiency in using the photosensitive material layer 90 region which is of a limited area. Thus, it results in a large decrease in the number of possible repeated exposures of the photosensitive material layer 90 for attaining desired alignment.

It is accordingly an object of the present invention to appropriately block exposure of such a photosensitive material layer, adjacent to a wafer, when an actual device area at a peripheral portion of the wafer is going to be exposed in an exposure apparatus as described above.

An exposure apparatus according to an aspect of the present invention may comprise a substrate holding table for holding a substrate and having a photosensitive material layer formed thereon, a stage which is movable while carrying the substrate holding table thereon, a projection optical system for projecting a pattern formed on an original onto the substrate, an observation optical system for detecting a mark formed on the photosensitive material layer through the projection optical system, and a control means operable to lithographically print the pattern of the original at different positions on the substrate while moving the stage, wherein a masking means may be provided to prevent exposure of the photosensitive material layer when the pattern of the original is lithographically printed on the substrate.

The photosensitive material layer may be made of a magneto-optic recording material or a photochromic material, for example.

The masking means may be disposed at a position within an illumination means and optically conjugate with the original or the substrate and it may be adapted to be driven so as to define an appropriate shape in dependence upon the exposure position on the substrate. Alternatively, it may have a member disposed with an appropriate shape close to and above the photosensitive material layer. As for the appropriate shape, it may satisfy the condition that a substrate is not blocked against light but any exposure light directed to the photosensitive material layer is completely blocked.

In an aspect of the present invention, for step exposure (printing) of a pattern of an original such as a reticle to a substrate such as a wafer, in accordance with the exposure position (shot area position) on the substrate the masking means may be operated to block a photosensitive material layer on the substrate holding table against exposure to light. This effectively avoids unnecessary exposure of an optical recording medium in the photosensitive material layer. This ensures repeated printing of marks on the photosensitive material layer through a number of repetitions, without unnecessary consumption of areas of the recording medium. Further, even where an erasable photosensitive recording medium is used, a number of mark printing operations can be effected without executing an erasing operation. This reduces the number of necessary erasing operations, and it effectively prolongs the durability of the photosensitive material layer.

The masking means is effective to prevent exposure of the photosensitive material layer around a substrate when the substrate is subjected to step exposure (printing). This avoids unnecessary exposure of the photosensitive material layer and thus prevents a decrease in the durability limit of the photosensitive material layer. As a result, it is possible to reduce the "down time" of the exposure apparatus necessitated by replacement of the photosensitive material layer or to reduce the required cost.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
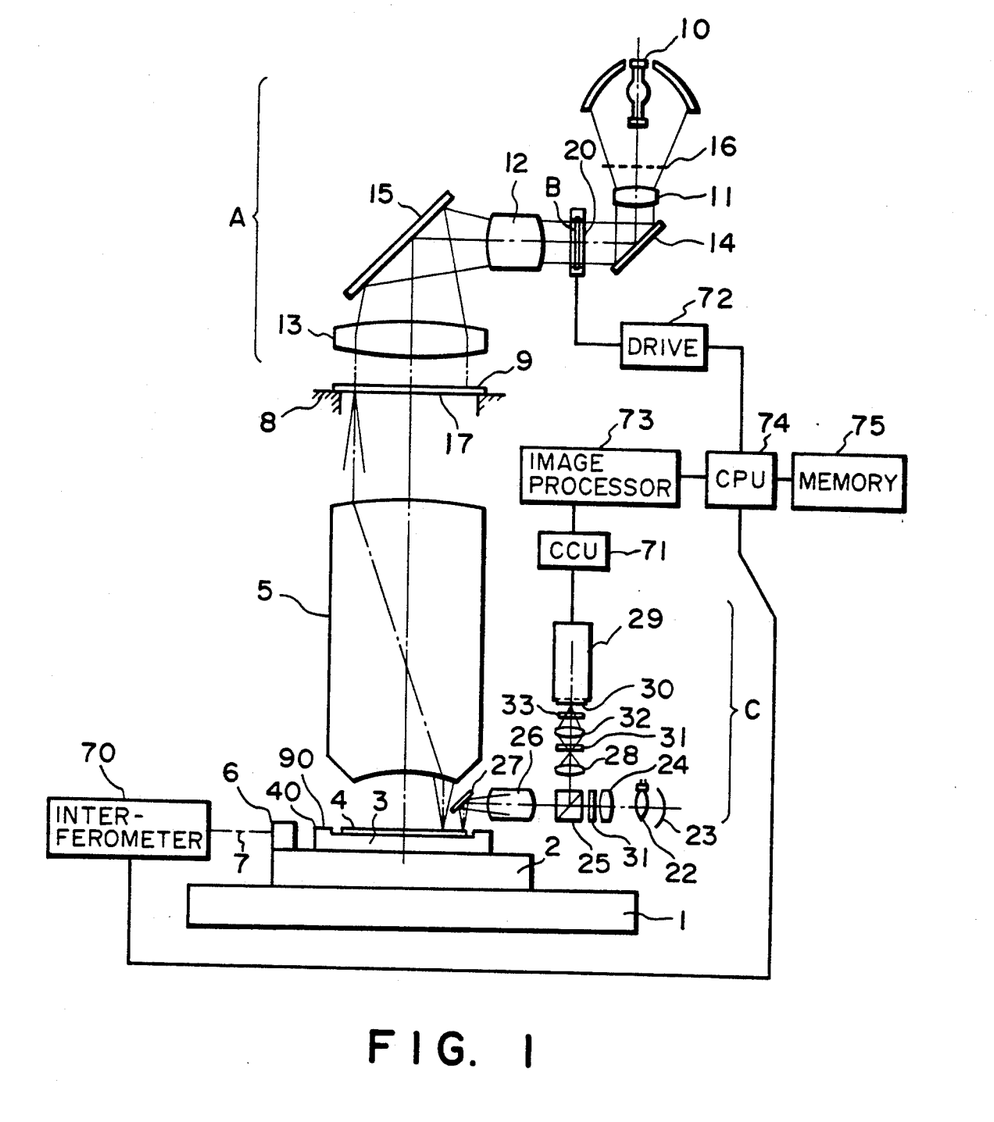
FIG. 1 is a schematic and diagrammatic view of an exposure apparatus to which an embodiment of the present invention is applied.

FIG. 1 shows a general structure of an alignment and exposure apparatus of step-and-repeat type to which an embodiment of the present invention is applied.

The main assembly of the exposure system is carried on a surface plate 1 (the entire structure thereof is not illustrated). Disposed on the surface plate 1 is a wafer stage 2 which is adapted to support a wafer chuck 3 and a wafer 4, held on the chuck 3 by attraction, for movement in a plane (X-Y plane) perpendicular to an optical axis of a projection lens system 5 and in a direction (Z-axis direction) along the optical axis. The wafer 4 surface is coated with a photoresist. The wafer stage 2 has formed thereon an optical mirror 6 on which a beam 7 from a laser interferometer 70 is projected, whereby the position coordinate of the wafer stage 2 can be detected in a known manner. In response to a signal corresponding to the detected coordinate, the movement of the wafer stage 2 through a specified distance can be controlled. Disposed above the projection lens system 5 is a reticle 9 which is held by a reticle holder 8. Disposed above the reticle 9 is an illumination optical system generally denoted at reference A. When light is supplied to the reticle 9 from the illumination optical system, a pattern formed on the reticle 9 can be transferred by projection onto the wafer 4, through the projection lens system 5.

The illumination optical system A comprises a light source 10 such as a super Hg lamp, first to third condenser lenses 11-13 provided to uniformly illuminate the surface of the reticle 9 with light supplied by the light source 10, and first and second mirrors 14 and 15 for deflecting the light. Shutter 16 is provided to control the exposure.

The second and third condenser lenses 12 and 13 and the second mirror 15 are arranged to cooperate with each other to define a plane B at a position which is substantially optically conjugate with a pattern bearing surface 17 of the reticle 9, and masking blades 20 are disposed at this position. With this arrangement, only a desired portion of the reticle 9 can be illuminated with exposure light from the illumination optical system A. Such masking blade means 20 is known in the art, as disclosed in U.S. Pat. No. 4,474,463. In this embodiment, four independently movable blades are used and are actuated by a driving circuit 72 to variably define a desired aperture of rectangular shape.

Disposed close to the projection lens system 5 is an off-axis alignment optical system C having an optical axis parallel to the optical axis of the projection lens system 5. The alignment optical system C is arranged such that light emanating from a light source 22 such as a halogen lamp is concentrated by a condensing mirror 23 and a condensing lens 24 and, after being directed by way of a first polarization plate 31, a half prism 25, an objective lens 26 and a mirror 27, it impinges on the wafer 4 surface or a portion of the wafer chuck 3 surface. The light reflected from the surface goes along its oncoming path and, after being reflected or transmitted by the mirror 27 and the objective lens 26, it is deflected upwardly by the half mirror 25. Thus, through a relay lens 28, the light is once imaged on a reference mark 31. The focused image of the wafer 4 and the pattern of the mark 31 are imaged on a tube surface 30 of an image pickup tube 29 by means of an erector 32. Second polarization plate 33 is disposed between the erector 32 and the image pickup tube 29. Thus, the alignment optical system C provides a polarization microscope. This arrangement is adopted in consideration of a case where a photosensitive material layer 90 (to be described later) is made of a magneto-optic recording material, so as to assure that an image formed on such photosensitive material layer is detected. Thus, when a photochromic material is used as the photosensitive material layer, no such polarization microscope is necessary and use of the second polarization plate is not necessary.

Signals from the image pickup tube 29 are transmitted through a CCU 71 to an image processing circuit 73, in which an image of the reference mark 31, an image of an alignment mark of the wafer 4 and an image of a pattern (magnetic image) formed on the photosensitive material layer (which will be described later) can be processed. For example, the image processing circuit 73 is operable to detect the positional relationship of the wafer alignment mark with the reference mark 31.

At a portion of the wafer chuck 3 surface, which is outside a wafer 4 (namely, the portion of the upper surface of the wafer chuck 3 that does not contact the wafer 4), there is provided a protrusion 40 whose surface has a level which is substantially equal to the level of the wafer 4 surface. The surface of the protrusion 40 is covered with a photosensitive material layer 90. Preferably, this photosensitive material layer is made of a material which can be used repeatedly. Examples of such material are a magneto-optic recording material and a photochromic material. But, the present invention is not limited to these materials. In the following description, it is assumed for convenience that a magneto-optic recording material is used.

Although not shown in the drawings, the alignment system is provided with means for erasing an image on the recording medium (photosensitive material layer 90).

Referring now to the flow chart of FIG. 2 and the top plan view of a reticle of FIG. 3 as well as top plan views of a wafer and a wafer chuck of FIGS. 4A and 4B, an example of the sequence of alignment and exposure that can be adopted in the exposure apparatus of the present invention will be explained.

Figure 3:
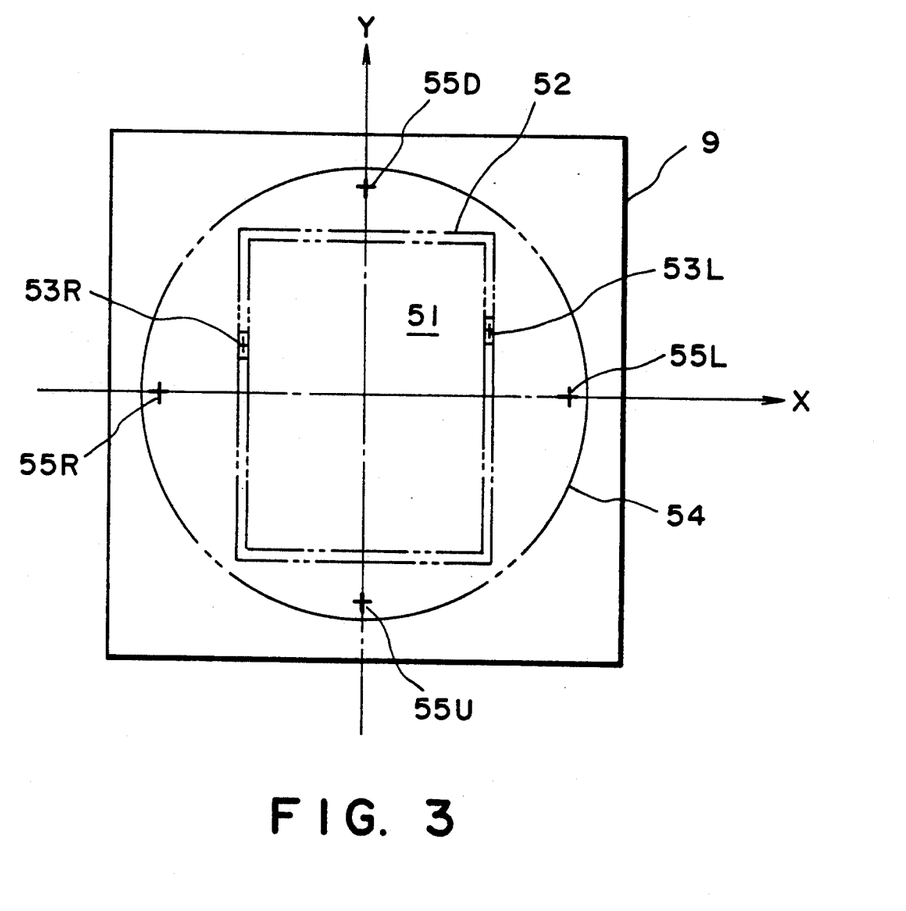
FIG. 3 is a schematic top plan view of a reticle prepared for an N-th process.
Figure 4A:
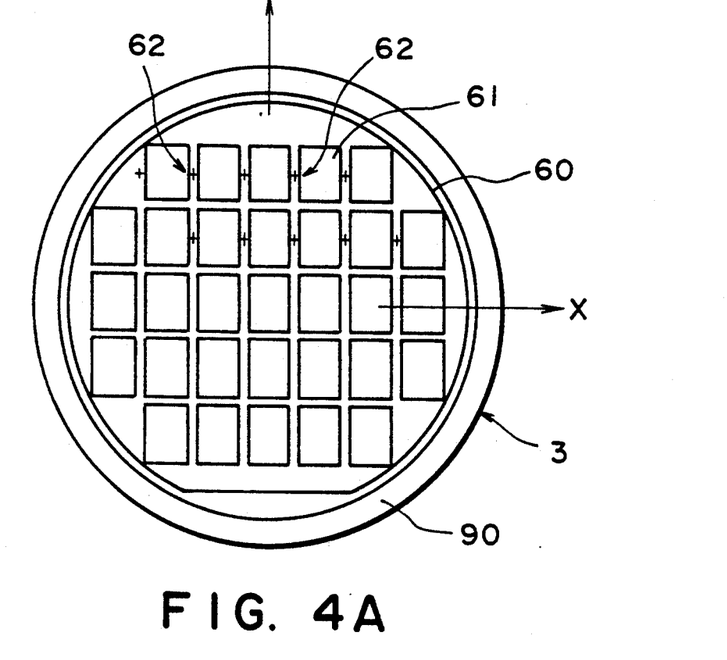
FIGS. 4A and 4B are top plan views, respectively, of a wafer and a wafer chuck for the N-th process.

Assuming now that the alignment and exposure procedure which is just going to be explained pertains to an N-th process for executing the patterning of an N-th layer of each semiconductor device, FIG. 3 just shows a reticle 50 for the N-th process. In FIG. 3, in a portion 52 which corresponds to a scribe line surrounding an actual device pattern region 51, there are provided wafer automatic alignment marks (called "AA marks") 53L and 53R which are to be used in a process or processes following the N-th process. Although these marks 53L and 53R can be used each as a mark to be projected upon a magneto-optic recording material layer (photosensitive material layer 90) provided at a peripheral portion of a wafer chuck, in this embodiment those marks 55D, 55U, 55L and 55R, which are formed in such region that corresponds to a range outside the actual device pattern region 51 (52) and inside the effective exposure region 54, are used for the pattern recording to be made on the magneto-optic recording material layer.

Figures 2, 2A:
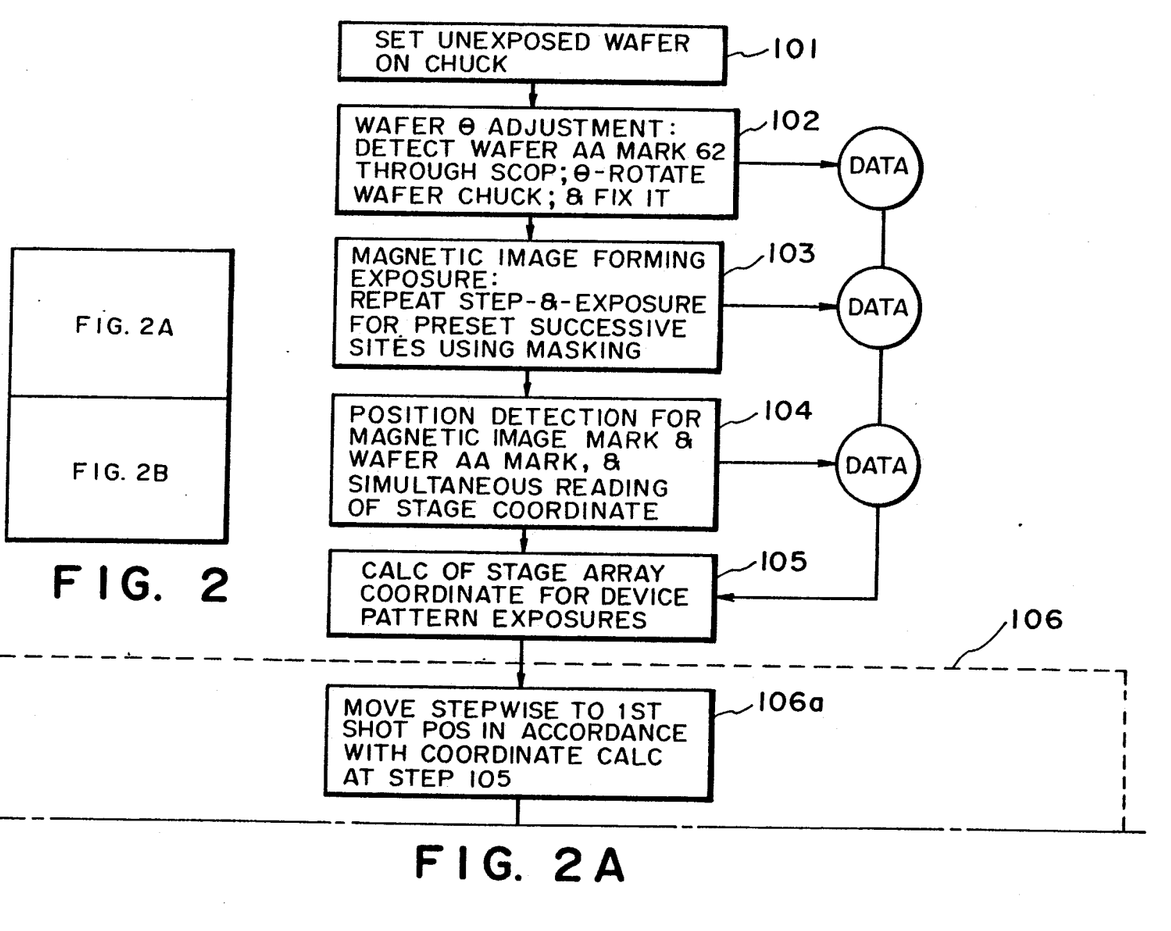
FIG. 2, 2A and 2B are a flow chart for explaining alignment and exposure procedure in the exposure apparatus of FIG. 1.
Figure 2B:
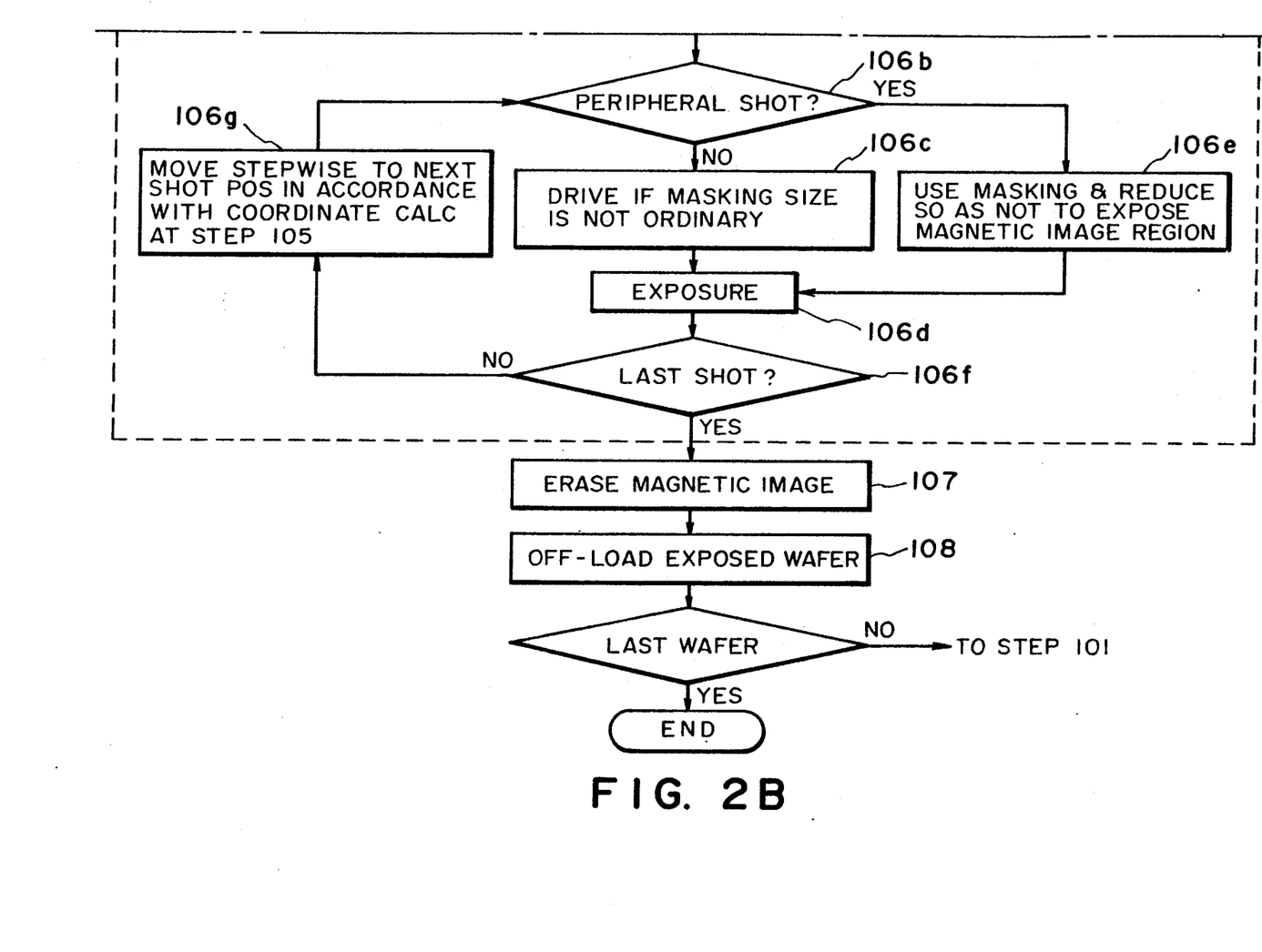

In the flow chart of FIG. 2, first a wafer 60 having been subjected to an (N-1)-th process is placed on and held by the wafer chuck 3 by attraction (Step 101). FIG. 4A shows this state. In FIG. 4A, rectangular patterns 61 arrayed on the wafer 60 are those actual device areas (shot areas) having been formed up to the (N-1)-th process. In the scribe lines between those actual device areas, there are wafer AA marks 62 for the N-th process, having been prepared during the preceding process. At this time, no pattern is formed on the magneto-optic recording material layer (photosensitive material layer) at the peripheral portion of the wafer chuck 3.

At Step 102 in the flow chart, wafer AA marks 62 provided at least at two spaced sites are detected through the alignment optical system C, and the wafer chuck 3 is rotationally adjusted in a $\theta$ direction so that the direction of array of the shot areas on the wafer 60 is aligned with a predetermined reference direction of the apparatus (for example, an X-axis direction). As the wafer array direction is aligned with the reference direction, the $\theta$ position of the wafer 4 is fixed. Of course, detected values ($\Delta ui$, $\Delta vi$) related to each wafer AA mark position as the wafer $\theta$ position is fixed, as well as the coordinate position ($xi$, $yi$) of the stage 2 at each corresponding time is memorized through a CPU 74 into a memory 75.

Subsequently, at Step 103, formation of a magnetic image or images on the photosensitive material layer 90 is executed. To this end, the wafer stage 2 is moved sequentially to preselected sites (on X-Y position coordinate) having been selected for formation of magnetic images, wherein at each site the shutter 16 is opened to execute the exposure, whereby magnetic images are formed on the photosensitive material layer 90. Until a predetermined number of magnetic images are formed, the step and exposure process is repeated. Of course, the coordinate position (Exj, Eyj) of the stage at each exposure is read and stored into the memory 75. The selection of the magnetic image forming alignment marks 55D, 55U, 55L and 55R of the reticle 50, for printing an image at an appropriate position on the photosensitive material layer 90, is made under the influence of the masking blade means 20. Also, the masking blade means 20 is used to prevent the exposure of any effective shot area on the wafer during the exposure of the magnetic image forming marks. The magnetic images formed as a result of these exposures are such as illustrated in FIG. 4B.

Figure 4B:
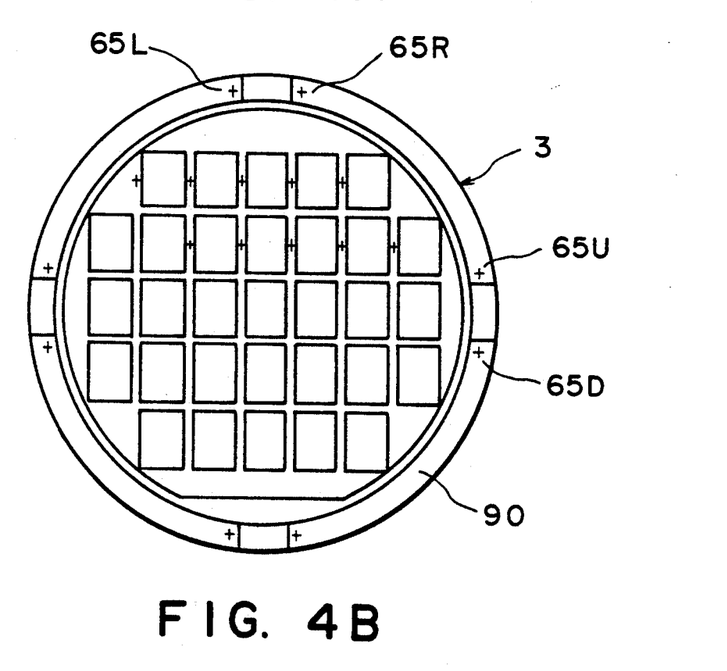

In this embodiment, as shown in FIG. 4B, four exposures may be made to form eight magnetic image marks 65 (65D, 65U, 65L and 65R) at upper, lower, left and right portions of the photosensitive material layer 90 of the chuck, as viewed in this figure.

At Step 104, by using the alignment optical system C and the laser interferometer 70, the position of each magnetic image mark 65j (j=L, R, U, D ...) as well as the position of each wafer/LA mark 62i (i=1, 2, 3, ...), namely, ($\Delta uj$, $\Delta vj$) and ($\Delta ui$, $\Delta vi$), are detected and, additionally, the coordinate position (xj, yj) (xi, yi) of the stage at each corresponding time is read. Here, the magnetic image marks and the wafer AA marks may be read in any desired order. However, it is preferable to so determine the order as to reduce the total time to the minimum.

It is to be noted here that the number of wafer AA marks to be detected, the number of shots for printing magnetic images, the number of marks to be selected as the subject of printing, the number of magnetic images to be detected, and the times of detecting operations to be made for each magnetic image and the like, during Steps 102-104, should be determined in accordance with the required overlay precision for the N-th process.

Thus, as regards the wafer AA marks at Step 104, for example, the maximum number is that of all the marks of all the shot areas. As for the minimum, on the other hand, use of the data at Step 102 may be considered in some case as being sufficient, such that the number of detections at Step 104 may be made zero.

In this embodiment, at some of the steps described hereinbefore, the projection magnification of the projection lens system 5 and any $\theta$ error of the reticle 9 can be checked. Also, in some cases, any positional error of the wafer 4 in the direction of the optical axis can be detected by detecting the contrast of the magnetic image, for example.

At Step 105, a computation may be made on the basis of the data obtained at Steps 102-104, for determination of the array coordinate to be used in the actual device pattern printing. While, also in this case, the coordinate can be calculated in various ways, basically, such coordinate system that has been obtained during the formation and detection of the magnetic images may be used as a reference to correct the coordinate data of the wafer AA mark.

Then, at Step 106, sequential stepwise movements of the wafer stage 2 accompanied by exposures are made in accordance with the coordinate of the device pattern array as determined at Step 105. In this case, the masking blade means 20 is used to restrict the illumination range by the illumination light, such that the illumination of the magnetic image forming alignment marks 55 of the reticle 9 is blocked.

The procedure having been described above is essentially the same as that disclosed in the aforementioned Japanese Laid-Open Patent Application, Laid-Open No. 1-286309.

Then, Step 106 which comprises Steps 106a–106f is effected. First, at Step 106a, the stage 2 is moved stepwise to a first shot position in accordance with the array coordinate having been determined by Steps 102–105, and the sequence goes into the step and exposure process. Then, from the stage coordinate position corresponding to the shot area which is just going to be exposed, whether that shot area is one of peripheral shot areas is discriminated. Here, a "peripheral shot area" means such a shot area with respect to which regular size exposure results in unwanted exposure of such portion of the photosensitive material layer 90 (magnetic image mark forming region) outside the wafer. In the FIG. 5A example, the areas 63U, 63D, 63R and 63L correspond to the peripheral shot areas, respectively.

If the shot area to be exposed is not such peripheral shot area, then at Step 106c the masking blade means 20 is adjusted to define an opening of regular size (if it is not of the regular size) and, at Step 106d, the exposure is effected. If the shot area is a peripheral shot area, the sequence goes to Step 106e where the masking blade means 20 is actuated to reduce its opening to adjust the exposure light flux so as not to expose the photosensitive material layer 90 and, thereafter, at Step 106d the exposure is effected. Here, as seen from the shot areas 63U, 63D, 63R and 63L in FIG. 5A, the direction and magnitude of reduction of the masking blade means 20 is different among the left, right, upper and lower sides of the wafer. Therefore, the respective masking blades are actuated in appropriate manners in respective directions.

After completion of the exposure, at Step 106f, a discrimination is made as to whether the exposed shot area is the last one. If not so, at Step 106g, the stepwise movement is made toward the next shot area, and the sequence goes back to Step 106b. If it is the last shot area, then the sequence goes to Step 107.

At Step 107, the magnetic images having been formed in a portion of the photosensitive material layer 90 on the wafer chuck 3 are erased. Where the wafer chuck 3 itself is provided with a suitable erasing means, the magnetic image may be erased before Step 106 or, alternatively, it may be erased in the course of Step 105 or 106.

Figure 5B:
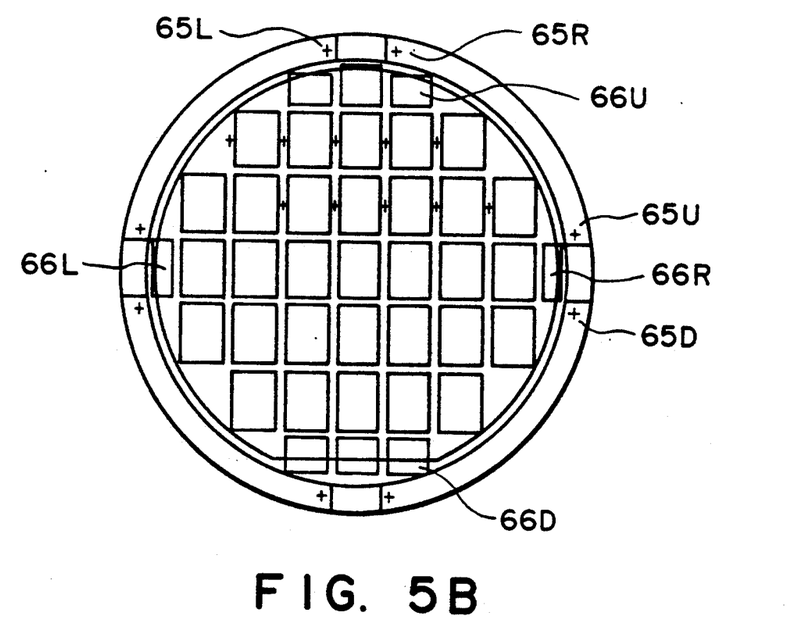

At step 108, the exposed wafer is off-loaded. Then, at Step 109, whether it is the last wafer in the N-th process is discriminated. If not so, the sequence goes back to Step 101 and the process of the next wafer is effected. If it is the last wafer, the N-th process is finished. The shot areas having been exposed in the described manner are such as those denoted at 66U, 66D, 66L and 66R in FIG. 5B. Thus, it is possible to expose all the shot areas of a wafer without exposing the photosensitive material layer 90.

For convenience, the present embodiment has been explained with reference to a case where the photosensitive recording medium of the photosensitive material layer 90 consists of a magneto-optic recording medium. However, similar effects are attainable when a different photosensitive recording medium such as a photochromic material, for example, is used. Also, with the present invention, it is possible to use a photosensitive recording material which has a low durability.

In the embodiment described above, the masking blade means 20 of the illumination optical system A which is upwardly of the projection lens system with respect to the light advancement direction is actuated to control the exposure range. However, in place thereof, the masking may be made at the side of the medium to be irradiated.

Figure 6:
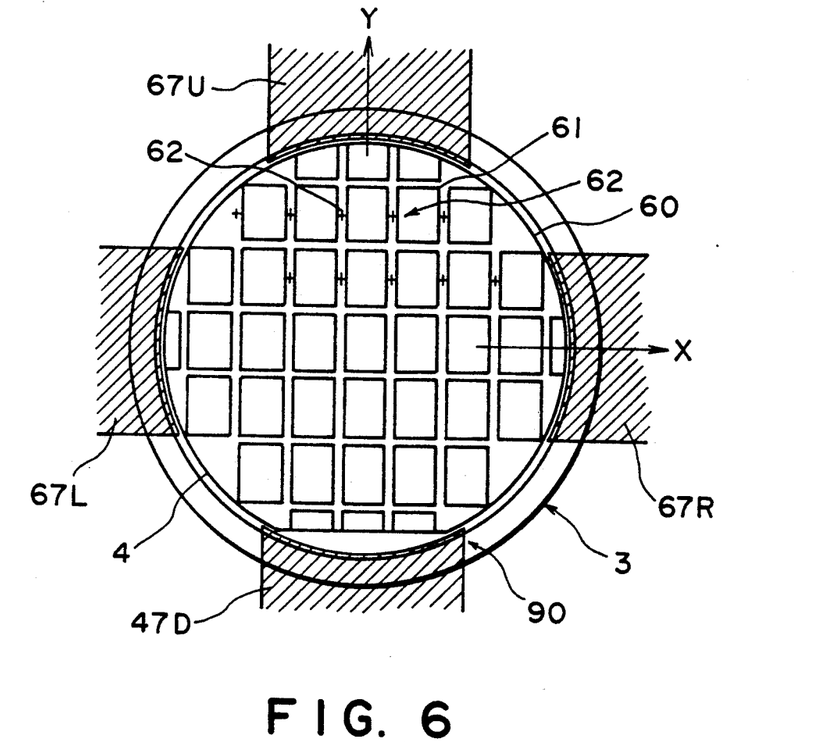
FIG. 6 is a top plan view of a wafer and a wafer chuck, being processed in accordance with another form of the present invention.

That is, when the step and exposure at Step 106 of FIG. 2 is effected, light blocking plates 67 (67L, 67U, 67R and 67D) such as shown in FIG. 6 may be inserted into a portion close to and above the photosensitive material layer 90 to prevent exposure of the photosensitive material layer 90. These light blocking plates 67 may be mounted on the stage 2 and may be held to continuously cover the photosensitive material layer 90 irrespective of stepwise movement of the stage 2. They may have a size and a shape suited to completely cover the portions of the photosensitive material layer 90 which portions might otherwise be exposed with the regular size exposure but not to interfere with the exposure of the wafer 4. The shape of the light blocking plates 67 is not limited to the form illustrated in FIG. 6, but any shape can be used unless the above condition is satisfied.

With this structure, it is not necessary to check whether a shot area to be exposed is a peripheral shot area or not. Also, it is not necessary to move and change the masking blades 20 into an optimum shape required, but they can be held stationary. This is effective to further enhance the throughput.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing exposure method for exposing different portions of a semiconductor wafer with radiation in a step-and-repeat manner, said method comprising the steps of:

placing the wafer on a wafer chuck;

detecting a first mark of the water, whereby a wafer mark signal is produced;

controlling a rotational position of the wafer chuck on the basis of the wafer mark signal;

printing an image of a second mark of a mask on a portion of a photosensitive material layer provided on a portion of the wafer chuck outside the wafer;

photoelectrically detecting the image of the second mark of the mask printed on the photosensitive layer, whereby a mask mark signal is produced;

producing data necessary for control of movement of the water chuck through a stage, by using the mask mark signal;

effecting step-and-repeat exposure of the different portions of the wafers by using a radiation beam while controlling the movement of the wafer chuck through the stage of the basis of the produced data; and blocking a portion of the radiation beam with use of a blocking member disposed between a source of the radiation beam and the wafer to prevent exposure of the photosensitive material layer during the step-and-repeat exposure, and using the blocking member to change the range of passage of the radiation beam when the portion of the wafer to be exposed changes between when an inside portion of the wafer is to be exposed and when an outside portion of the wafer is to be exposed.

2. A method according to claim 1, further comprising the step of then erasing the image of the mark printed on the photosensitive material layer.

3. A method according to claim 2, further comprising the steps of:
 disposing the blocking member on a plane which is substantially optically conjugate with the mask; and
 changing the position of the block member along the plane between when a central portion of the wafer is to be exposed with the radiation beam and when a peripheral portion of the wafer is to be exposed with the radiation beam.

4. A method according to claim 2, further comprising the step of disposing the block member adjacent to the wafer chuck.

5. A method according to claim 1, wherein the photosensitive material layer comprises one of a magneto-optic recording material and a photochromic material.

6. An exposure method for exposing different portions of a substrate with radiation in a step-and-repeat manner, said method comprising the steps of:
 placing the substrate on a chucking member;
 illuminating a mask with a radiation beam, whereby an image of a mark of a mask is printed through a projection optical system on a portion of a photosensitive material layer provided on a portion of the chucking member outside the substrate;
 photoelectrically detecting the image of the mark of the mask printed on the photosensitive layer, without using the projection optical system, whereby a mask mark signal is produced;
 producing data necessary for control of movement of the chucking member, by using the mask mark signal;
 illuminating the mask with a radiation beam while controlling the movement of the chucking member through a stage on the basis of the produced data, so as to print a pattern of the mask on different portions of the substrate sequentially through the projection optical system to perform step-and-repeat exposure of the substrate; and
 blocking a portion of the radiation beam with use of a blocking member disposed between a source of the radiation beam and the substrate to prevent exposure of the photosensitive material layer during the step-and-repeat exposure, and using the blocking member to change the range of passage of the radiation beam when the portion of the wafer to be exposed changes between when an inside portion of the wafer is to be exposed and when an outside portion of the wafer is to be exposed.

7. A method used in a step-and-repeat exposure method for sequentially exposing different zones of a semiconductor wafer for the manufacture of semiconductor devices, wherein a wafer is held by a wafer chuck and, while moving the wafer chuck with a movable stage, the different zones of the wafer are exposed with exposure light, comprising the steps of:
 providing a photosensitive material on the wafer chuck and outside the wafer held thereon; and
 placing a block member in a portion of a path of the exposure light between the wafer and a light source supplying the exposure light, so as to block a portion of the exposure light to prevent the photosensitive material from being irradiation with the exposure light during the step-and-repeat exposure of the wafer, and using the blocking member to change the range of passage of the radiation beam when the portion of the wafer to be exposed changes between when an inside portion of the wafer is to be exposed and when an outside portion of the wafer is to be exposed.

8. A method according to claim 7, wherein further comprising the step of placing the blocking member on and moving the blocking member along a plane which is substantially optically conjugate with a mask.

9. A method according to claim 7, wherein said placing step comprises the step of placing the blocking member close to the wafer chuck.

10. A method according to claim 7, wherein the photosensitive material comprises a magneto-optic recording material.

11. A method according to claim 7, wherein the photosensitive material comprises a photochromic material.

12. A method according to claim 7, further comprising the step of controlling the movement of the wafer chuck through the wafer stage, wherein said controlling step comprises the step of producing necessary data comprising the step of:
 illuminating the mask with the exposure light whereby, through a projection lens system, a mark of the mask is printed on the photosensitive material;
 photoelectrically detecting the printed image of the mark mask by using a mark detecting optical system, whereby a mask mark image signal is produced; and
 producing the necessary data, for the control of the wafer chuck movement, by using the produced signal.

13. A method according to claim 12, wherein the printed image of the mask mark on the photosensitive material is able to be erased.

14. A method according to claim 7, further comprising the step of controlling the movement of the wafer chuck through the wafer stage, wherein said controlling step comprises the step of producing necessary data comprising the steps of:
 detecting a mark of the wafer, whereby a wafer mark signal is produced;
 controlling the position of the wafer chuck on the basis of the wafer mark signal;
 illuminating the mask with the exposure light whereby, through a projective lens system, a mark of the mask is printed on the photosensitive material;
 photoelectrically detecting the printed image of the mask mark by using a mark detecting optical system, whereby a mask mark image signal is produced; and
 producing the necessary data, for the control of the wafer chuck movement, by using the produced wafer mark signal and the produced mask mark image signal.

15. A method according to claim 14, wherein the printed image of the mask mark on the photosensitive material is able to be erased.

* * * * *

UNITED STATES PATENT AND TRADEMARK OFFICE
CERTIFICATE OF CORRECTION

PATENT NO. : 5,331,371
DATED : July 19, 1994
INVENTOR(S) : TETSUYA MORI, ET AL.

Page 1 of 3

It is certified that error appears in the above-indentified patent and that said Letters Patent is hereby corrected as shown below:

ON THE COVER PAGE

[56] References Cited

U.S. PATENT DOCUMENTS

"5,003,342 1/1991 Nishi" should read
              --5,003,342 3/1991 Nishi--.

FOREIGN PATENT DOCUMENTS

"1286309 11/1989 Japan" should read --1-286309
              11/1989 Japan--.

SHEET 2 OF THE DARWINGS IN FIG. 2A

In step S102, "SCOP" should read --ALIGNMENT OPTICAL
        SYSTEM C--.

COLUMN 1

Line 21, "mances" should read --mance characteristics --.
    Line 23, "characteristics" should read --characteristic--
    Line 32, "type of process" should read --types of
        processes:--.
    Line 45, "aligners," should read --aligner,--.
    Line 52, "this, need" should read --this need--.

COLUMN 2

Line 6, "such case" should read --such a case--.

UNITED STATES PATENT AND TRADEMARK OFFICE
CERTIFICATE OF CORRECTION

PATENT NO.  : 5,331,3710
DATED       : July 19, 1994
INVENTOR(S) : TETSUYA MORI, ET AL.

It is certified that error appears in the above-indentified patent and that said Letters Patent is hereby corrected as shown below:

COLUMN 5

Line 59, "is" should read --are--.

COLUMN 6

Line 23, "wafer/LA" should read --wafer AA--.

COLUMN 8

Line 45, "water," should read --wafer--.
Line 59, "wafers" should read --wafer--.
Line 61, "of" (first occurrence), should read --on--.

COLUMN 9

Line 19, "block" should read --blocking--.

UNITED STATES PATENT AND TRADEMARK OFFICE
CERTIFICATE OF CORRECTION

PATENT NO. : 5,331,371

DATED : July 19, 1994

INVENTOR(S) : TETSUYA MORI, ET AL.

It is certified that error appears in the above-indentified patent and that said Letters Patent is hereby corrected as shown below:

COLUMN 10

Line 3, "irradiation" should read --irradiated--.
Line 11, "wherein" should be deleted.
Line 27, "step" should read --steps--.
Line 33, "mark mask" should read --mask mark--.

Signed and Sealed this

Twenty-seventh Day of December, 1994

Attest:

BRUCE LEHMAN

Attesting Officer

Commissioner of Patents and Trademarks